US011252834B2

(12) United States Patent
Cao et al.

(10) Patent No.: US 11,252,834 B2
(45) Date of Patent: Feb. 15, 2022

(54) ELECTRONIC APPARATUS

(71) Applicant: BOE Technology Group Co., Ltd., Beijing (CN)

(72) Inventors: Lei Cao, Beijing (CN); Jinggang Wei, Beijing (CN); Long Yang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/766,553

(22) PCT Filed: Oct. 23, 2019

(86) PCT No.: PCT/CN2019/112772
§ 371 (c)(1),
(2) Date: May 22, 2020

(87) PCT Pub. No.: WO2020/093870
PCT Pub. Date: May 14, 2020

(65) Prior Publication Data
US 2020/0389990 A1      Dec. 10, 2020

(30) Foreign Application Priority Data

Nov. 5, 2018   (CN) .......................... 201821821718.7

(51) Int. Cl.
*H05K 5/02*    (2006.01)
*H05K 5/00*    (2006.01)
*H05K 5/03*    (2006.01)

(52) U.S. Cl.
CPC ......... *H05K 5/0286* (2013.01); *H05K 5/0017* (2013.01); *H05K 5/03* (2013.01)

(58) Field of Classification Search
None
See application file for complete search history.

(56) References Cited

U.S. PATENT DOCUMENTS 5,541,684 A * 7/1996 Suzuki ............... G03B 1/50
396/380
8,605,451 B2 * 12/2013 Tang ............... H04B 1/3816
361/754

(Continued)

FOREIGN PATENT DOCUMENTS

CN    202495048 U    10/2012
CN    203193688 U     9/2013

(Continued)

OTHER PUBLICATIONS

International Search Report with English language translation, International Application No. PCT/CN2019/112772, dated Jan. 23, 2020, 13 pp.

*Primary Examiner* — Xanthia C Cunningham
(74) *Attorney, Agent, or Firm* — Myers Bigel, P.A.

(57) ABSTRACT

An electronic apparatus includes a display module and an electronic apparatus housing for installing the display module. The electronic apparatus housing includes a housing body and a back cover. The housing body defines a groove in which a first adsorption component and a retaining slot are arranged. The back cover includes a back cover body and a second adsorption component arranged on a first end of the back cover body. The back cover and the housing body are engaged with each other through the adsorption action between the first adsorption component and the second adsorption component, and a cavity structure is formed between a second end of the back cover body and the housing body.

16 Claims, 6 Drawing Sheets

(56) References Cited

U.S. PATENT DOCUMENTS

| | | | | |
|---|---|---|---|---|
| 8,896,991 | B2* | 11/2014 | Ternus | H04M 1/0277 361/679.02 |
| 2002/0154474 | A1* | 10/2002 | Merz | G06F 1/1662 361/679.55 |
| 2010/0166208 | A1* | 7/2010 | Kato | H04R 5/0335 381/74 |
| 2011/0281444 | A1* | 11/2011 | Yasuoka | H01R 13/447 439/39 |
| 2012/0050972 | A1* | 3/2012 | Ho | G06F 3/0202 361/679.4 |
| 2015/0062927 | A1* | 3/2015 | Hirakata | G09F 9/301 362/362 |
| 2016/0282593 | A1* | 9/2016 | Yan | H04M 1/026 |
| 2016/0284942 | A1* | 9/2016 | Gao | H01L 33/483 |
| 2017/0003516 | A1* | 1/2017 | Kiyamura | G02B 27/646 |
| 2018/0156397 | A1* | 6/2018 | Poon (Pan) | F21S 2/00 |
| 2018/0359868 | A1* | 12/2018 | Li | H01F 7/02 |
| 2019/0011953 | A1 | 1/2019 | Hu et al. | |
| 2019/0258295 | A1* | 8/2019 | Fujimoto | G09F 9/00 |
| 2019/0355938 | A1* | 11/2019 | Chen | C23C 14/042 |

FOREIGN PATENT DOCUMENTS

| | | |
|---|---|---|
| CN | 103473523 A | 12/2013 |
| CN | 204577655 U | 8/2015 |
| CN | 204793356 U | 11/2015 |
| CN | 206251081 U | 6/2017 |
| CN | 206517458 U | 9/2017 |
| CN | 209390507 U | 9/2019 |
| JP | 2003331975 A | 11/2003 |
| JP | 2014023096 A | 2/2014 |

* cited by examiner

ELECTRONIC APPARATUS

CROSS REFERENCE TO RELATED APPLICATIONS

The present application is a 35 U.S.C. 371 national stage application of PCT International Application No. PCT/CN2019/112772, filed on Oct. 23, 2019, which claims the benefit of Chinese Patent Application No. 201821821718.7, filed on Nov. 5, 2018, the entire contents of which are incorporated herein by reference in their entireties.

TECHNICAL FIELD

The disclosure relates to the technical field of electronic apparatus, in particular to an electronic apparatus housing and electronic apparatus.

BACKGROUND

With the development of electronic apparatus technology, the usage times of electronic apparatuses such as mobile phones, electronic photo frames and electronic picture screens have become longer and longer.

Generally, replaceable devices can be disposed in electronic apparatuses. For example, the replaceable devices can be at least one of memory cards, Subscriber Identification Module (SIM) cards, batteries, etc. In order to facilitate the replacement of the replaceable device, a groove for assembling the replaceable device can be provided in the housing of the electronic apparatus. A back cover matched with the opening shape of the groove is assembled to the groove to avoid the replaceable device from being exposed or falling off from the electronic apparatus.

At present, the back cover and the housing are usually engaged through a snap-fit structure. Because the connection relationship formed by the snap-fit structure is relatively tight and difficult to remove, the removal process of the back cover from the housing in the current electronic apparatus is relatively complicated.

SUMMARY

In view of this, in a first aspect, some exemplary embodiments of the present disclosure provide an electronic apparatus including a display module and an electronic apparatus housing for mounting the display module, wherein the electronic apparatus housing includes:

a housing body, wherein the housing body defines a groove in which a first adsorption component and a retaining slot are arranged; and a back cover including a back cover body and a second adsorption component disposed on a first end of the back cover body;

Wherein, the back cover and the housing body are engaged with each other through adsorption action between the first adsorption component and the second adsorption component, and a cavity structure is formed between a second end of the back cover body and the housing body.

Optionally, the cavity structure is between the second end of the back cover body and a bottom surface of the groove.

Optionally, a first convex structure is arranged in the groove, and the first adsorption component is arranged in an area where the first convex structure is located.

Optionally, the first convex structure has a first accommodating space therein, and the first adsorption component is disposed in the first accommodating space.

Optionally, the retaining slot is arranged in the first convex structure, and the retaining slot is not communicated with the first accommodating space.

Optionally, the retaining slot and the first accommodating space are arranged one above the other, or alternatively the retaining slot and the first accommodating space are arranged side by side.

Optionally, the groove is a stepped groove, the bottom surface of the groove comprises a first bottom surface and a second bottom surface. The distance between the first bottom surface and the opening of the groove is less than the distance between the second bottom surface and the opening of the groove. The first adsorption component is arranged on the first bottom surface.

Optionally, the thickness of one end of the back cover provided with the second adsorption component is greater than the thickness of one end not provided with the second adsorption component.

Optionally, a second accommodating space is arranged in the back cover body, and the second adsorption component is disposed in the second accommodating space.

Optionally, the second adsorption component is disposed on a surface of the back cover body facing the bottom surface of the groove.

Optionally, a surface of the back cover facing away from the bottom surface of the groove is flush with a surface of the housing body facing away from the bottom surface of the groove, and a shape of the back cover is the same as that of the opening of the groove.

Optionally, the surface of the back cover facing away from the bottom surface of the groove is provided with a second convex structure, and the second convex structure and the second adsorption structure are respectively positioned at two ends of the back cover body.

Optionally, the first adsorption component and the second adsorption component are both magnets. Alternatively, one of the first adsorption component and the second adsorption component is a magnet and the other is a metal sheet structure.

Optionally, an elastic support component is arranged in the cavity structure.

In a second aspect, some exemplary embodiments of the present disclosure provide an electronic apparatus including a display module and an electronic apparatus housing for mounting the display module, wherein the electronic apparatus housing includes a housing body defining a groove in which a first adsorption component and a retaining slot are arranged, and the groove is further adapted to accommodate a second adsorption component for adsorbing with the first adsorption component.

Optionally, a first convex structure is arranged in the groove, and the first adsorption component is disposed in an area of the groove where the first convex structure is located.

Optionally, the first convex structure has a first accommodating space therein, and the first adsorption component is disposed in the first accommodating space.

Optionally, the retaining slot is arranged in the first convex structure, and the retaining slot is not communicated with the first accommodating space.

BRIEF DESCRIPTION OF THE DRAWINGS

In order to more clearly explain the technical solution in the embodiment of the present disclosure, the following will briefly introduce the drawings needed in the embodiment description. Obviously, the drawings in the following description are only some exemplary embodiments of the present disclosure. For those of ordinary skill in the art, other drawings can be obtained according to these drawings without creative effort.

DETAILED DESCRIPTION OF THE DISCLOSURE

In order to make the objects, technical solutions and advantages of the present disclosure clearer, the embodiments of the present disclosure will be described in further detail below with reference to the accompanying drawings.

An electronic apparatus housing and an electronic apparatus described in some exemplary embodiments of the present disclosure can solve the problem that the process of detaching a back cover from the housing in the electronic apparatus in the prior art is relatively complicated.

Figure 1:
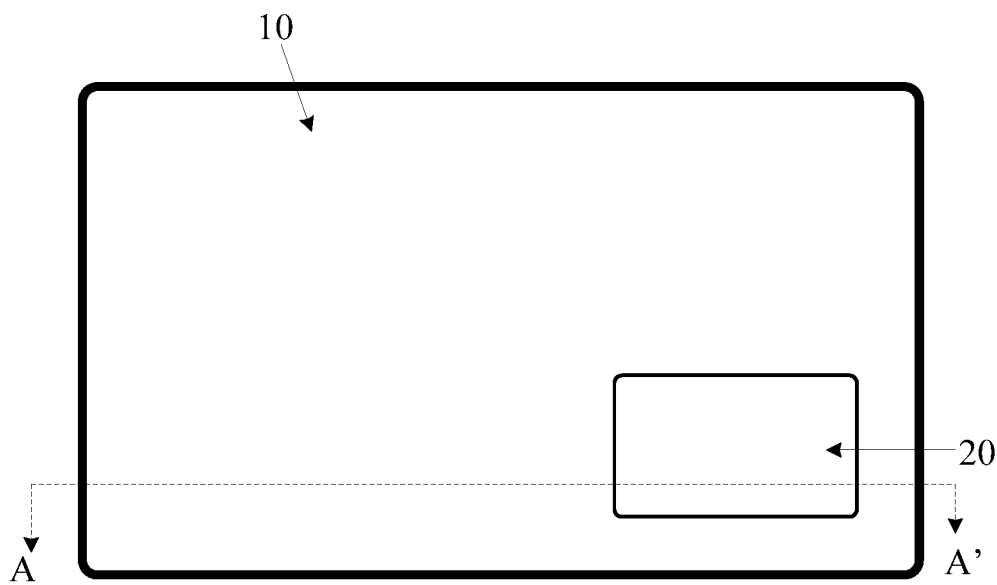
FIG. 1 is a schematic structural view of an electronic apparatus housing provided by some exemplary embodiments of the present disclosure.

Please refer to FIG. 1, which is a schematic structural view of an electronic apparatus housing provided by some exemplary embodiments of the present disclosure. The electronic apparatus housing 100 includes a housing body 10 and a back cover 20.

Figure 2:
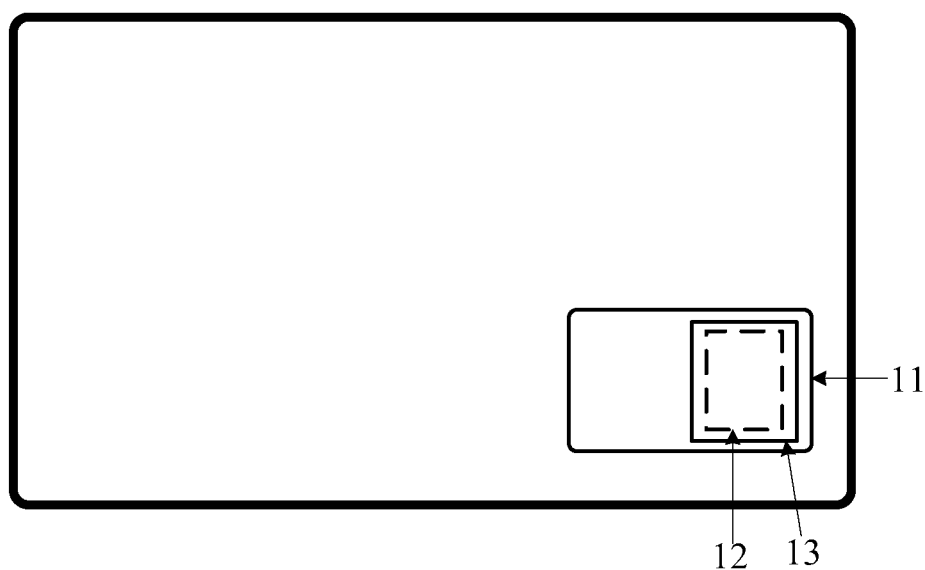
FIG. 2 is a schematic structural view of a housing body provided by some exemplary embodiments of the present disclosure.

FIG. 2 is a schematic structural view of the housing body 10 (excluding the back cover 20) provided by some exemplary embodiments of the present disclosure, which can more clearly show the structure of the housing body 10. The housing body 10 includes a groove 11, and a first adsorption component 12 and a retaining slot 13 arranged in the groove 11, wherein the retaining slot 13 is configured to install a replaceable device, which may be, for example, but not limited to, at least one of a memory card, a SIM card, and a battery. It should be noted that the expression "the first adsorption component and the retaining slot are arranged in the groove" herein includes at least one of the following three situations: the first adsorption component and the retaining slot are arranged in a bottom surface of the groove, arranged in a side wall of the groove, or arranged in the housing body at positions close to the bottom surface of the groove.

Figure 3:
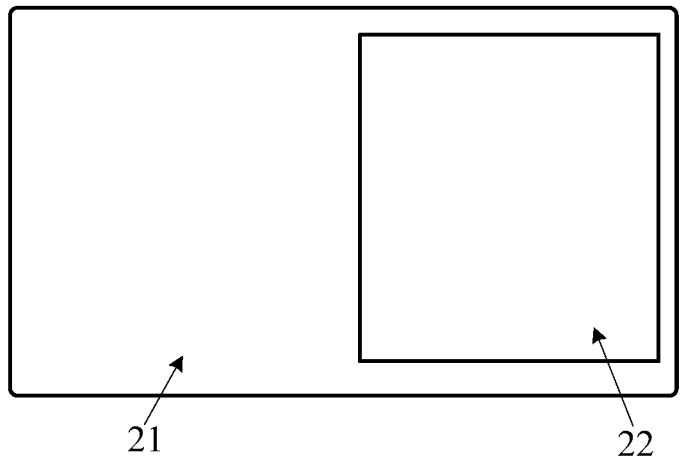
FIG. 3 is a schematic structural view of a back cover provided by some exemplary embodiments of the present disclosure.

FIG. 3 is a schematic structural view of a back cover 20 provided by some exemplary embodiments of the present disclosure, which can more clearly show the structure of the back cover 20. The back cover 20 includes a back cover body 21 and a second adsorption component 22 disposed at a first end of the back cover body 21.

Figure 4:
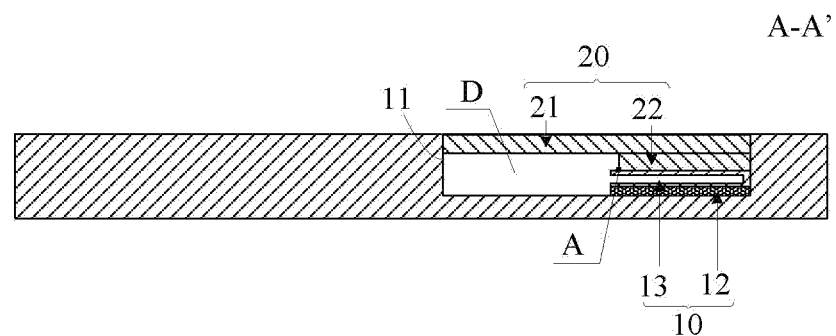
FIG. 4 is a sectional view along A-A' of FIG. 1.

FIG. 4 is a sectional view along A-A' of FIG. 1, which can more clearly show the connection relationship between the housing body 10 and the back cover 20. The back cover 20 and the housing body 10 are configured such that when the back cover 20 is placed in the groove 11 of the housing body 10, the back cover 20 and the housing body 10 can be engaged with each other by adsorption between the first adsorption component 12 and the second adsorption component 22, and a cavity structure D can be formed between a second end of the back cover body 21 and the bottom surface of the groove 11.

The technical effects of the housing 100 provided by some exemplary embodiments of the present disclosure are explained below. Since the housing 100 includes the housing body 10 and the back cover 20. The housing body 10 comprises the groove 11, and the first adsorption component 12 and the retaining slot 13 arranged in the groove 11. The back cover 20 includes the back cover body 21 and the second adsorption component 22 disposed on the first end of the back cover body 21. After the back cover 20 is placed in the groove 11 of the housing body 10, the back cover 20 and the housing body 10 are engaged to each other through adsorption between the first adsorption component 12 and the second adsorption component 22, and the cavity structure D can be formed between the second end of the back cover body 10 and the housing body 10 (e.g., the bottom surface of the groove 11). When the back cover 20 needs to be detached from the housing body 10, only the second end of the back cover body 21 needs to be pressed, so that the first end of the back cover body 21 is raised or protruded out of the housing body 10, thereby facilitating an operator to pull out the back cover 20 from the groove 11 of the housing body 10. Therefore, the process of detaching the back cover 20 from the housing body 10 is effectively simplified. Further, in a process of installing the back cover 20 on the housing body 10, it is not necessary to ensure that the back cover 20 is accurately aligned with the opening of the groove 11 of the housing body 10, instead it only needs to ensure that the second adsorption component 22 can adsorb onto the first adsorption component 12, thus effectively simplifying the process of installing the back cover 20 onto the housing body 10.

By way of example, adsorption action can be generated between the first adsorption component 12 and the second adsorption component 22, that is, an adsorption force can be generated between the first adsorption component 12 and the second adsorption component 22. Therefore, under the action of the adsorption force, adsorption connection can be realized between the housing body 10 and the back cover 20.

It should be noted that the adsorption action between the first adsorption component 12 and the second adsorption component 22 can also be manually released, so that the back cover 20 can be detached from the groove 11. For example, when the back cover 20 needs to be detached from the housing body 10, only the second end of the back cover body 21 needs to be pressed. At this time, a fulcrum A can be formed at a certain position of the back cover 20. Under the action of the fulcrum A, the first end of the back cover body 21 is raised relative to the housing body 10, facilitating the operator to pull the back cover 20 out of the groove 11 of the housing body 10, effectively simplifying the process of detaching the back cover 20 from the housing body 10.

Furthermore, in the process of installing the back cover 20 onto the housing body 10, it is not necessary to ensure that the back cover 20 is accurately aligned with the opening of the groove 11 of the housing body 10, but instead it only needs to ensure that the second adsorption component 22 can adsorb onto the first adsorption component 12, so the operator can release the back cover 20 held in his hand at a certain distance from the first adsorption component 12, and at this time, the back cover 20 is installed on the housing body 10 under the adsorption action generated between the first adsorption component 12 and the second adsorption component 22, effectively simplifying the installation process of the back cover 20 onto the housing body 10.

In summary, some exemplary embodiments of the present disclosure provide a housing including a housing body and a back cover. The housing body comprises a groove, and a first adsorption component and a retaining slot which are arranged in the groove. The back cover comprises a back cover body and a second adsorption component arranged on a first end of the back cover body. After the back cover is placed in the groove of the housing body, the back cover and the housing body are adsorbed and connected through the first adsorption component and the second adsorption component, and a cavity structure can be formed between a second end of the back cover body and the housing body (e.g., the bottom surface of the groove). When the back cover needs to be detached from the housing body, only the second end of the back cover body needs to be pressed, so that the first end of the back cover body is raised relative to the end face of the housing body, thus facilitating an operator to pull the back cover out of the groove of the housing body, and effectively simplifying the process of detaching the back cover from the housing body. Furthermore, in the process of installing the back cover on the housing body, it is not necessary to ensure that the back cover is accurately aligned with the opening of the groove of the housing body, instead it only needs to ensure that the second adsorption component is able to be adsorbed on the first adsorption component, thus effectively simplifying the process of installing the back cover on the housing body.

In some exemplary embodiments of the present disclosure, after the back cover 20 is placed in the groove 11 of the housing body 10, there are various implementations to form the cavity structure D between the second end of the back cover body 21 and the housing body 10. The embodiments of the present disclosure are schematically illustrated by taking the following three implementations as examples.

Figure 5:
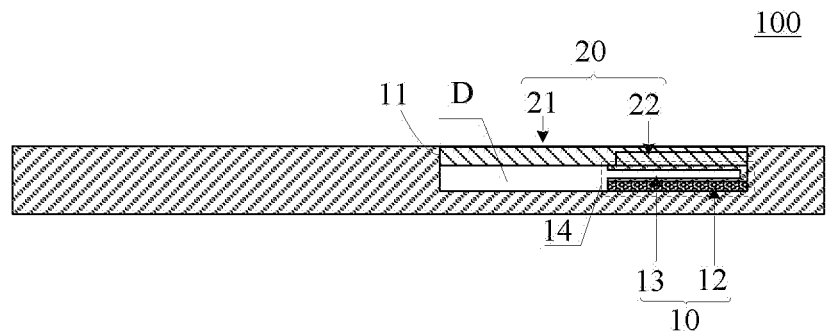
FIG. 5 is a schematic structural view of an electronic apparatus housing provided by other exemplary embodiments of the present disclosure.
Figure 6:
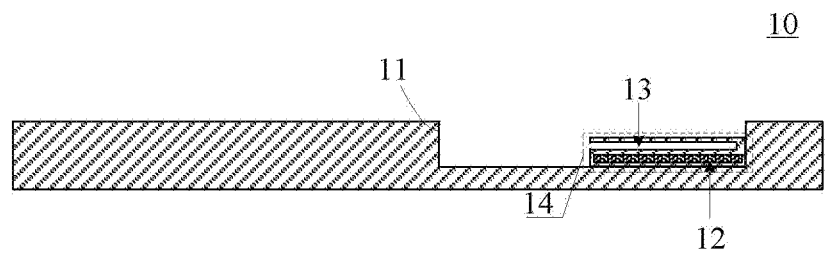
FIG. 6 is a schematic structural view of another housing body provided by some exemplary embodiments of the present disclosure.
Figure 7:
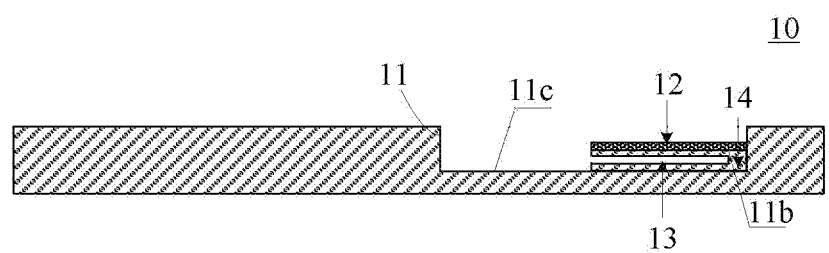
FIG. 7 is a schematic structural view of yet another housing body provided by some exemplary embodiments of the present disclosure.

The first implementation can be as shown in FIGS. 5-7, wherein FIG. 5 is a schematic structural view of a housing provided by some other exemplary embodiments of the present disclosure. The groove 11 is provided with a first convex structure 14 therein, and the first adsorption component 12 is disposed in an area of the groove 11 where the first convex structure 14 is located. When the back cover 20 is placed in the groove 11 of the housing body 10, the area of the groove 11 other than the area where the first convex structure 14 is located and the area occupied by the back cover 20 is the area of the cavity structure D.

In the first implementation, the first adsorption component 12 may be disposed inside the first convex structure 14, or may be disposed on a surface of the first convex structure 14 facing away from the bottom surface of the groove 11 or a surface facing the bottom surface of the groove 11.

When the first adsorption component 12 is disposed inside the first convex structure 14, as shown in FIG. 6, which is a schematic structural view of another housing body provided by some exemplary embodiments of the present disclosure. The first convex structure 14 has a first accommodating space therein, and the first adsorption component 12 can be disposed in the first accommodating space.

Optionally, a retaining slot 13 may also be provided in the first convex structure 14. The retaining slot 13 may be provided at either side in the first convex structure 14. However, in order to avoid a card replacement device installed in the retaining slot 13 from being affected by the first adsorption component 12, it is necessary to ensure that the retaining slot 13 does not communicate with the first accommodating space.

It should be noted that FIG. 6 only schematically illustrates an example in which the retaining slot 13 and the first accommodating space are arranged one above the other, and the retaining slot 13 is closer to the opening of the groove 11 than to the first accommodating space. However, it should be noted that the first accommodating space may be arranged closer to the opening of the groove 11 than to the retaining slot 13. Alternatively, the retaining slot 13 and the first accommodating space can be arranged side by side. Alternatively, the retaining slot 13 may also be arranged in the side wall of the groove 11. The embodiments of the present disclosure are not specifically limited to this.

The first adsorption component 12 can be disposed on a surface of the first convex structure 14 facing away from the bottom surface of the groove 11 or a surface facing toward the bottom surface of the groove 11, as shown in FIG. 7, which is a schematic structural view of yet another housing body provided by some exemplary embodiments of the present disclosure, and is illustrated by taking the first adsorption component 12 disposed on the surface of the first convex structure 14 facing away from the bottom surface of the groove 11 as an example. The groove 11 is a stepped groove, and the bottom surface of the groove 11 includes a first bottom surface 11b and a second bottom surface 11c. The distance between the first bottom surface 11b and the opening of the groove 11 is less than the distance between the second bottom surface 11c and the opening of the groove 11. The first bottom surface 11b is a top surface of the first convex structure 14, and the first adsorption component 12 is disposed on the first bottom surface 11b.

Figure 8:
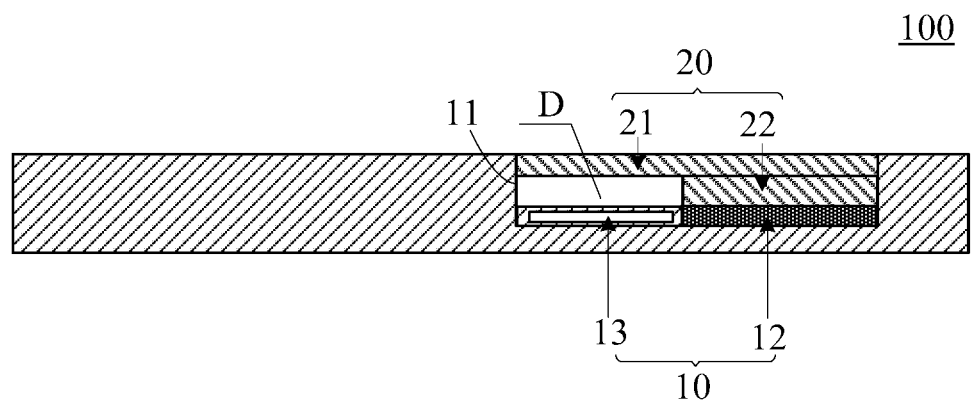
FIG. 8 is a schematic structural view of another electronic apparatus housing provided by other exemplary embodiments of the present disclosure.

Optionally, the retaining slot 13 can be arranged in the first convex structure 14, for example, the retaining slot 13 and the first adsorption component 12 are arranged one above the other and parallel to each other (as shown in FIG. 7). The retaining slot 13 can also be provided in the second bottom surface 11c (as shown in FIG. 8). The retaining slot 13 can also be provided in the side wall of the groove 11. The embodiments of the present disclosure are not specifically limited to this.

It should be noted that in the above-mentioned first implementation, the thickness of the back cover 20 may be uniform, that is, the second adsorption component 22 does not protrude with respect to the back cover body 21. For example, the second adsorption component 22 may be embedded in the back cover body to be flush with the back cover body 21.

A second implementation of forming a cavity structure D between the second end of the back cover body 21 and the housing body 10 is shown in FIG. 8, which is a schematic structural view of another housing provided by other exemplary embodiments of the present disclosure. The thickness of one end of the back cover 20 provided with the second adsorption component 22 is larger than that of one end not provided with the second adsorption component 22. At this time, when the back cover 20 is placed in the groove 11 of the housing body 10, a cavity structure D can be formed between the bottom surface of the groove 11 and one end of the back cover 20 where the second adsorption component 22 is not provided.

It should be noted that in the above-mentioned second implementation, as shown in FIG. 8, the first adsorption component 12 and the retaining slot 13 in the groove 11 are arranged side by side, and the height of the first adsorption component 12 disposed on the bottom surface of the groove 11 is the same as that of the convex structure arranged on the bottom surface of the groove 11 for arranging the retaining slot 13. Of course, the first adsorption component 12 and the retaining slot 13 may both be arranged in the housing body 10 at positions close to the bottom surface of the groove 11.

Figure 9:
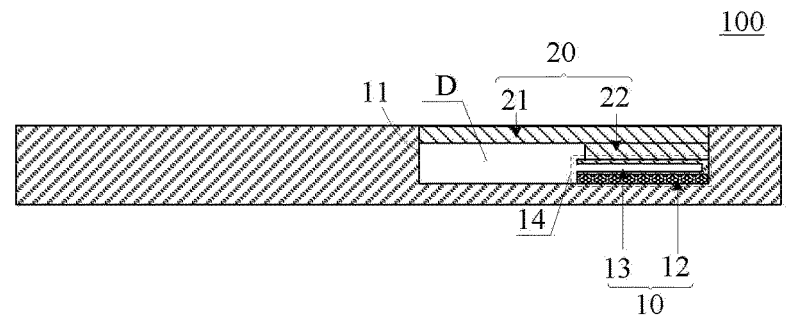
FIG. 9 is a schematic structural view of a further electronic apparatus housing provided by other exemplary embodiments of the present disclosure.

A third implementation of forming a cavity structure D between the second end of the back cover body 21 and the housing body 10 is shown in FIG. 9, which is a schematic structural view of a further housing provided by other exemplary embodiments of the present disclosure. The groove 11 has a first convex structure 14 therein, and the first adsorption component 12 is disposed in an area of the groove 11 where the first convex structure 14 is located. Moreover, the thickness of one end of the back cover 20 where the second adsorption component 22 is provided is greater than the thickness of one end where the second adsorption component 22 is not provided. At this time, when the back cover 20 is placed in the groove 11 of the housing body 10, the cavity structure D can be formed between the bottom surface of the groove 11 and one end of the back cover 20 where the second adsorption component 22 is not provided, and the cavity structure D includes an area in the groove 11 other than the area where the first convex structure 14 is located and the area occupied by the back cover 20 (including the second adsorption component 22).

It should be noted that in the third implementation, the specific structure of the first convex structure 14 may correspond to or be similar to that in the above-mentioned first implementation, and will not be repeated here.

Optionally, in the above three implementations, the first adsorption component 12 may be bonded to the housing body 10 by glue or double-sided adhesive, or may be connected by a snap-fit structure, which is not limited in embodiments of the present disclosure.

Optionally, in the above three implementations, the second adsorption component 22 may be disposed inside the back cover body 21 or may be disposed on the outer surface of the back cover body 21, for example, on the lower surface of the back cover body 21 as shown in FIG. 4.

Figure 10:
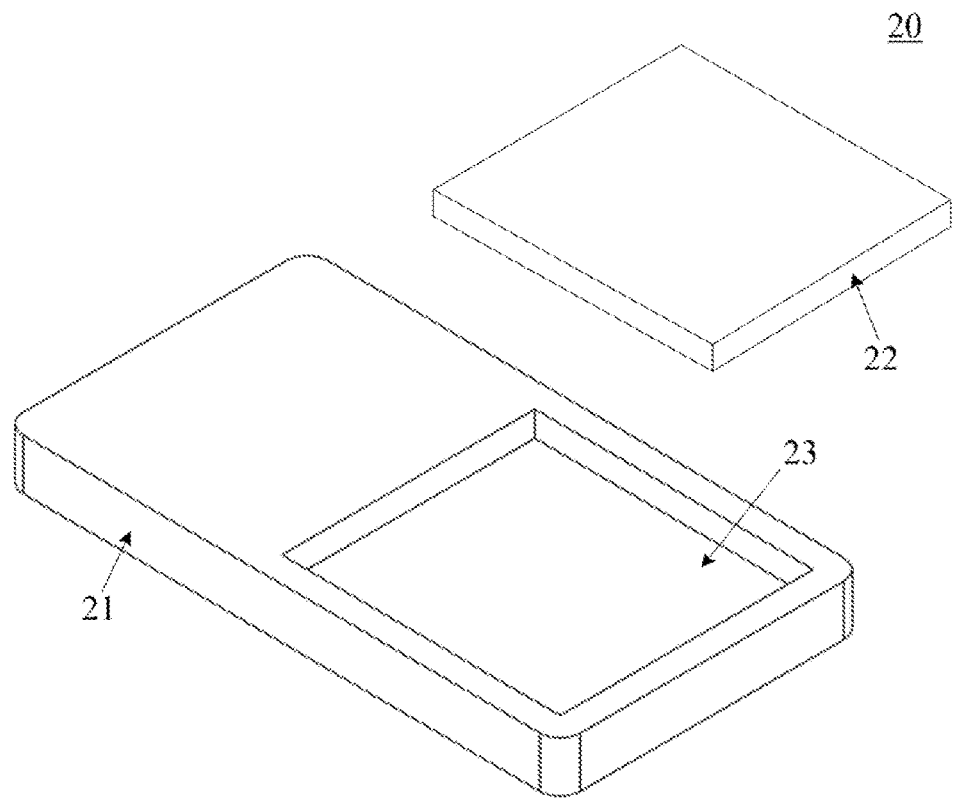
FIG. 10 is an exploded view of another back cover provided by some exemplary embodiments of the present disclosure.

Exemplarily, when the second adsorption component 22 is disposed on the outer surface of the back cover body 21, please refer to FIG. 10, which is an exploded view of another back cover provided by some exemplary embodiments of the present disclosure. The back cover body 21 is provided with a groove-shaped structure 23 located in a surface of the back cover body 21 facing the bottom surface of the groove, and the second adsorption component 22 can be accommodated in the groove-shaped structure 23. In some exemplary embodiments of the present disclosure, the second adsorption component 22 and the groove-shaped structure 23 are in interference fit. The back cover body 21 and the second adsorption component 22 can be manufactured separately, and then the second adsorption component 22 and the back cover body 21 are assembled. For example, the second adsorption component 22 and the back cover body 21 can be assembled by means of special tools, which can include a support plate and a pressing plate, wherein the support plate is provided with a slot structure for carrying the second adsorption component 22. When the second adsorption component 22 is placed in the slot structure, the back cover body 21 is placed on the support plate, and the groove-shaped structure 23 in the back cover body 21 is ensured to be aligned with the second adsorption component 22, and then the back cover body 21 is pressed by the pressing plate until the second adsorption component 22 is installed in the groove-shaped structure 23.

Figure 11:
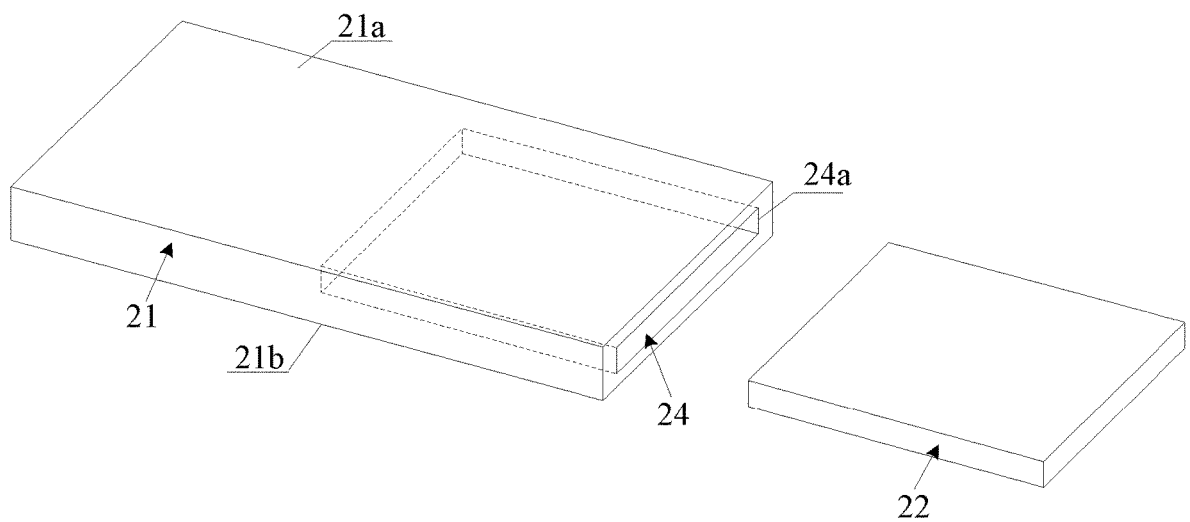
FIG. 11 is an exploded view of yet another back cover provided by some exemplary embodiments of the present disclosure.

Exemplarily, when the second adsorption component is disposed inside the back cover body 21, please refer to FIG. 11, which is an exploded view of a further back cover provided by some exemplary embodiments of the present disclosure. The back cover body 21 has a second accommodating space 24 therein, and the second adsorption component 24 may be disposed in the second accommodating space 24. It should be noted that the second accommodating space 24 is located at a position where the first end of the back cover body 21 is located. For example, the second accommodating space 24 has an opening 24a communicating with the outside. The second adsorption component 24a can be installed into the second accommodating space 24 through the opening 24a. The second adsorption component 22 and the second accommodating space 24 are in interference fit. In another optional implementation, the second accommodating space 24 is a substantially sealed space, and the second adsorption component 22 and the back cover body 21 in the back cover 20 can be formed by injection molding.

In some exemplary embodiment of that present disclosure, when the second adsorption component 22 is disposed in the second accommodating space 24 in the back cover body 21, each of the two bottom surfaces in the back cover body 21 (i.e., the upper bottom surface 21a and the lower bottom surface 21b in FIG. 11) may face the groove in the housing body, and at this time, the back cover 20 has a fool-proof function (i.e., a function of avoiding erroneous installation), further simplifying the process of installing the back cover 20 on the housing body.

Optionally, as shown in FIGS. 5, 8 and 9, the surface of the back cover 20 facing away from the bottom surface of the groove 11 (i.e., the top surface in the figure) is coplanar or flush with the top surface of the housing body 10, and the shape of the back cover 20 is the same that of the opening of the groove 11, effectively improving the aesthetics of the housing.

Figure 12:
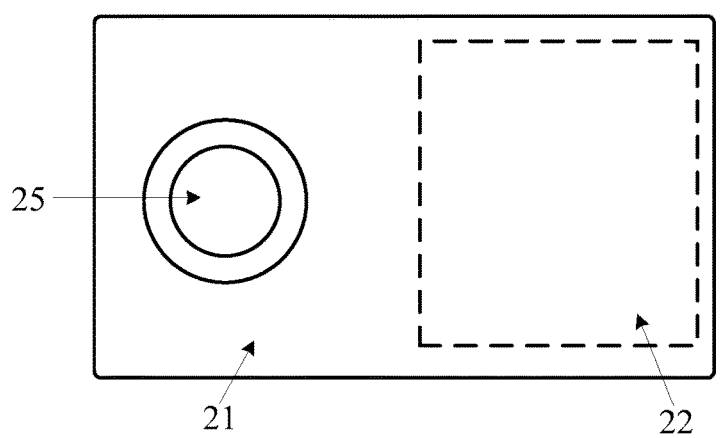
FIG. 12 is a schematic structural view of a further back cover provided by some exemplary embodiments of the present disclosure.

Optionally, as shown in FIG. 12 which is a schematic structural view of yet another back cover provided by some exemplary embodiments of the present disclosure, the surface of the back cover 20 facing away from the bottom surface of the groove 11 is provided with a second convex structure 25, and the second convex structure 25 and the second adsorption structure 22 are respectively positioned at two ends of the back cover body 21. Through the convex structure 25, the operator can quickly find the second end of the back cover body 21, further simplifying the process of detaching the back cover 20 from the housing body 10.

In some exemplary embodiments of the present disclosure, the structure that enables the first adsorption component 12 and the second adsorption component 22 to generate adsorption therebetween can be implemented in various ways. The embodiments of the present disclosure will be schematically illustrated by taking the following two optional implementations as examples.

In a first optional implementation for generating adsorption between the first adsorption component 12 and the second adsorption component 22, the first adsorption component 12 and the second adsorption component 22 can both be magnets.

In some exemplary embodiments of the present disclosure, after the back cover 20 is placed in the groove 11 of the housing body 10, one end of the first adsorption component 12 contacting the second adsorption component 22 is a first pole, and one end of the second adsorption component 22 contacting the first adsorption component 12 is a second pole. The first pole and the second pole are N and S poles, respectively. That is, the first pole is N pole and the second pole is S pole. Alternatively, the first pole is an S pole and the second pole is an N pole.

In a second optional implementation for generating adsorption between the first adsorption component 12 and the second adsorption component 22, one of the first adsorption component 12 and the second adsorption component 22 can be a magnet and the other can be a metal sheet structure. The material of the metal sheet structure may be iron or alloy material or the like.

Assuming that the first adsorption component 12 is a metal sheet structure and the second adsorption component 22 is a magnet, one end of the second adsorption component 22 contacting the first adsorption component 12 can be an N pole or an S pole.

The magnet in the above-mentioned first and second optional implementations may be permanent magnet or non-permanent magnet. When the magnet is a permanent magnet, the permanent magnet can be a natural magnet. When the magnet is a non-permanent magnet, the non-permanent magnet may be an electromagnet. It should be noted that when the magnet is a non-permanent magnet, it is also necessary to provide a corresponding drive circuit in the housing body 10 and/or the back cover housing 21, through which the magnet can be controlled to have the adsorption action.

In some exemplary embodiments of the present disclosure, as shown in FIGS. 5, 8 and 9, since there is the cavity structure D between the back cover body 21 and the housing body 10, the second end of the back cover body 21 is prone to fall into the cavity structure D with respect to the housing body 10 due to its own gravity. The second end of the back cover body 21 can be prevented from falling into the cavity structure D in the following three ways.

In a first way: it needs to ensure that the volume of the cavity structure D is less than half of the volume of the groove 11.

In a second way: it needs to ensure that the adsorption force between the first adsorption component 12 and the second adsorption component 22 is greater than a preset adsorption force threshold value which is related to the volume ratio of the volume of the cavity structure D and the volume of the groove 11, and the mass of the back cover body 21.

In a third way: an elastic support component can be arranged in the cavity structure D to support the second end of the back cover body 21 to a certain extent, and the elastic support component does not affect the pressing by the operator on the second end of the back cover body 21 during the detachment of the back cover 20, so the back cover 20 can be normally detached from the groove 11. The elastic support component may be provided on the bottom surface of the groove 11 or on the surface of the back cover body 21 facing the groove 11 (i.e., the bottom surface in FIG. 4). The elastic support component may be a spring or a film layer having elasticity.

To sum up, the housing provided by the embodiment of the present disclosure includes a housing body and a back cover. The housing body comprises a groove, and a first adsorption component and a retaining slot which are disposed in the groove. The back cover comprises a back cover body and a second adsorption component arranged on the first end of the back cover body. After the back cover is placed in the groove of the housing body, the back cover and the housing body are engaged through the adsorption between the first adsorption component and the second adsorption component, and a cavity structure can be formed between a second end of the back cover body and the housing body (e.g., the bottom surface of the groove). When the back cover needs to be detached from the housing body, only the second end of the back cover body needs to be pressed, so that the first end of the back cover body is raised relative to the end face of the housing body, thus facilitating an operator to pull the back cover out of the groove of the housing body, and effectively simplifying the process of detaching the back cover from the housing body. Furthermore, in the process of installing the back cover on the housing body, it is not necessary to ensure that the back cover is aligned with the opening of the groove of the housing body, instead it only needs to ensure that the second adsorption component can adsorb onto the first adsorption component, thus effectively simplifying the process of installing the back cover on the housing body.

Figure 13:
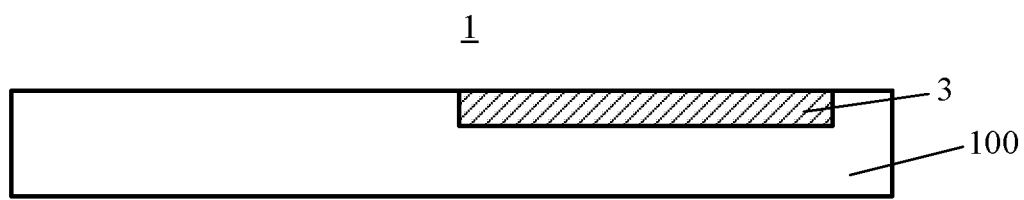
FIG. 13 is a schematic structural view of an electronic apparatus provided by some exemplary embodiments of the present disclosure.

Referring to FIG. 13, some exemplary embodiments of the present disclosure also provide an electronic apparatus 1 including a display module 3 and a housing 100 for mounting the display module, which may be the housing 100 shown in FIG. 1, 5, 8 or 9. The electronic apparatus 1 can be mobile phones, electronic photo frames, electronic picture screens and other apparatuses with replaceable devices. The retaining slot in the groove in the housing can be equipped with a replaceable device, and the replaceable device can be at least one of a memory card, a SIM card and a battery.

It should be understood that although various features and beneficial effects of the present disclosure and specific details of the structure and function of the present disclosure have been set forth in the above description, these are merely exemplary, and the specific details thereof, especially the shape, size, number and arrangement of means, may be specifically changed within the scope of the principles of the present disclosure to the overall scope represented by the broad general meaning as claimed in the claims of the present disclosure.

Unless otherwise defined, all technical and scientific terms used in this specification have the same meaning as commonly understood by those skilled in the art to which this disclosure belongs.

Those skilled in the art will understand the term "substantially" herein (such as in "substantially all light" or in "substantially consists of"). The term "substantially" may also include embodiments having "wholly", "completely", "all", etc. Therefore, in the embodiments, the adjective is also substantially removable. Where applicable, the term "substantially" may also refer to 90% or more, such as 95% or more, specifically 99% or more, even more specifically 99.5% or more, including 100%. The term "comprising"

also includes embodiments in which the term "comprising" means "consisting of". The term "and/or" specifically refers to one or more of the items mentioned before and after "and/or". For example, the phrase "item 1 and/or item 2" and similar phrases may relate to one or more of items 1 and 2. The term "comprising" may refer to "consisting of" in one embodiment, but may also refer to "including at least a defined category and optionally one or more other categories" in another embodiment.

Furthermore, the terms first, second, third, etc. in this specification and in the claims are used to distinguish between similar elements and do not denote any order, quantity, or importance. It should be understood that the terms so used are interchangeable under appropriate circumstances and that the embodiments of the present disclosure described herein are capable of operation in a different order than described or illustrated herein.

"Up", "Down", "Left" and "Right" are only used to indicate the relative positional relationship. When the absolute position of the described object changes, the relative positional relationship may also change accordingly.

It should be noted that the above-mentioned embodiments illustrate rather than limit the present disclosure, and that those skilled in the art will be able to design many alternative embodiments without departing from the scope of the appended claims. In the claims, any reference signs placed between parentheses shall not be construed as limiting the claims. The use of the verb "to include" and its conjugations does not exclude the presence of elements or steps other than those stated in a claim. The words "a" or "an" in the claims of the present disclosure do not exclude plural numbers, and are only intended for convenience of description and should not be construed as limiting the scope of protection of the present disclosure.

The present disclosure may be implemented by means of hardware comprising several distinct elements, and by means of a suitably programmed computer. In the device claim enumerating several means, several of these means can be embodied by the same item of hardware. The mere fact that certain measures are recited in mutually different dependent claims does not indicate that a combination of these measures cannot be used to advantage.

The present disclosure is further applicable to devices that include one or more of the characterizing features described in this specification and/or shown in the drawings. The present disclosure further relates to methods or processes that include one or more of the characterizing features described in this specification and/or shown in the drawings.

Various aspects discussed in this disclosure may be combined to provide additional advantages. In addition, those skilled in the art will understand that embodiments can be combined, and more than two embodiments can also be combined. In addition, some features may form the basis of one or more divisional applications.

The invention claimed is:

1. An electronic apparatus comprising:
a display module; and
an electronic apparatus housing configured for mounting the display module, wherein the electronic apparatus housing comprises:
a housing body, wherein the housing body comprises a groove and a first adsorption component and a retaining slot arranged in the groove; and
a back cover comprising a back cover body and a second adsorption component on a first end of the back cover body,
wherein the back cover and the housing body are engaged with each other through adsorption action between the first adsorption component and the second adsorption component, and a cavity structure is defined between a second end of the back cover body and the housing body.

2. The electronic apparatus according to claim 1, wherein the cavity structure is between the second end of the back cover body and a bottom surface of the groove.

3. The electronic apparatus according to claim 1, further comprising a first convex structure in the groove, wherein the first adsorption component is in or on the first convex structure.

4. The electronic apparatus according to claim 3, wherein the first convex structure has a first accommodating space therein, and the first adsorption component is in the first accommodating space.

5. The electronic apparatus according to claim 4, wherein the retaining slot is in the first convex structure, and the retaining slot is not in communication with the first accommodating space.

6. The electronic apparatus according to claim 5, wherein the retaining slot and the first accommodating space are arranged one above another relative to a bottom surface of the groove.

7. The electronic apparatus according to claim 5, wherein the retaining slot and the first accommodating space are arranged side by side in the groove.

8. The electronic apparatus according to claim 2, wherein the groove is a stepped groove, wherein the bottom surface of the groove comprises a first bottom surface and a second bottom surface, wherein a distance between the first bottom surface and an opening of the groove is less than a distance between the second bottom surface and the opening of the groove, and wherein the first adsorption component is on the first bottom surface.

9. The electronic apparatus according to claim 1, wherein a thickness of one end of the back cover comprising the second adsorption component is greater than a thickness of another end of the back cover that is remote from the second adsorption component.

10. The electronic apparatus according to claim 1, wherein the back cover body has a second accommodating space therein, and the second adsorption component is in the second accommodating space.

11. The electronic apparatus according to claim 2, wherein the second adsorption component is on a surface of the back cover body facing the bottom surface of the groove.

12. The electronic apparatus according to claim 2, wherein a surface of the back cover facing away from the bottom surface of the groove is coplanar with a surface of the housing body facing away from the bottom surface of the groove, and wherein the back cover and an opening of the groove comprise a same shape.

13. The electronic apparatus according to claim 2, wherein a surface of the back cover facing away from the bottom surface of the groove comprises a second convex structure, and the second convex structure and the second adsorption component are at respective ends of the back cover body.

14. The electronic apparatus according to claim 1, wherein the first adsorption component and the second adsorption component are both magnets.

15. The electronic apparatus according to claim 1, wherein one of the first adsorption component or the second adsorption component is a magnet and another of the first adsorption component or the second adsorption component is a metal sheet structure.

16. The electronic apparatus according to claim 1, further comprising an elastic support component in the cavity structure.

\* \* \* \* \*